(12) United States Patent
Kolla et al.

(10) Patent No.: US 7,242,624 B2
(45) Date of Patent: Jul. 10, 2007

(54) METHODS AND APPARATUS FOR READING A FULL-SWING MEMORY ARRAY

(75) Inventors: Yeshwant N. Kolla, Raleigh, NC (US); Gregory Christopher Burda, Raleigh, NC (US); Jeffrey Herbert Fischer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 11/152,982

(22) Filed: Jun. 14, 2005

(65) Prior Publication Data

US 2006/0280003 A1 Dec. 14, 2006

(51) Int. Cl.
*G11C 7/00* (2006.01)

(52) U.S. Cl. .............................. 365/189.08; 365/230.06
(58) Field of Classification Search ............ 365/189.08
See application file for complete search history.

(56) References Cited

U.S. PATENT DOCUMENTS 5,357,477 A * 10/1994 Matsumoto et al. ... 365/230.02
5,828,594 A * 10/1998 Fujii ........................... 365/63
6,292,401 B1 * 9/2001 Zhang et al. .......... 365/189.02
6,584,034 B1 * 6/2003 Hsu et al. .............. 365/230.05
2005/0036389 A1 * 2/2005 Kim ....................... 365/230.03
2005/0216698 A1 * 9/2005 Chu et al. ...................... 712/1

* cited by examiner

*Primary Examiner*—Tan T. Nguyen
(74) *Attorney, Agent, or Firm*—Nicholas J. Pauley; John L. Ciccozzi; Joseph B. Agusta (57) ABSTRACT

Techniques for reducing power when reading a full-swing memory array are disclosed. The full-swing memory array includes a plurality of local bit lines and a global bit line. In order to reduce power consumption, a method of driving the global bit line includes the step of coupling the plurality of local bit lines to the global bit line through a plurality of tri-state devices. The method further includes the steps of generating a global select signal to enable one of the plurality of tri-state devices and selecting a corresponding local bit line to drive the output of the enabled tri-state device. In this way, the global bit line is statically driven so that consecutive reads of bits having the same value read over the global bit line do not result in transitioning the state of the global bit line.

13 Claims, 7 Drawing Sheets

METHODS AND APPARATUS FOR READING A FULL-SWING MEMORY ARRAY

BACKGROUND OF THE INVENTION

1. Field of the Invention

The present invention relates generally to improvements related to reading a full-swing memory array, and, more particularly, to advantageous techniques for statically driving a global bit line in the full-swing memory array.

2. Relevant Background

Full-swing memory arrays utilize a dynamic precharge and discharge technique when reading bits stored in a memory cell. This conventional technique is typically divided into two levels to minimize diffusion capacitance carried on bit lines within a full-swing memory array. The first level of a full-swing memory array includes storage cells, pass transistors, and local bit lines. A storage cell stores a binary value. The pass transistor is driven by a read word line to discharge a local bit line based on a memory cell's content. The local bit line is typically shared by multiple read word lines. The local bit line is precharged high so that a transition on a memory read can be recognized. The local bit line provides input to the second level.

The second level of a full-swing memory array typically includes a number of inverters and pull-down transistor pairs where each pair is provided input by one local bit line. The pull-down transistors connect to a dynamically precharged global bit line. This memory array is termed full-swing because the local and global bit lines need to be pulled to ground in order to recognize a 0 value stored in a memory cell. When reading consecutive 0 values from a memory cell, a conventional lull-swing memory array requires pre-charging and discharging of the local and global bit lines. The pre-charging of the local and global bit lines must occur before a read word line signal is asserted. The discharging occurs as a 0 value is propagated through the second level. In this way, power is consumed by the pre-charging and discharging of both the local and global bit lines during a read when consecutive 0 values are propagated over the global bit line.

Furthermore, in conventional full-swing memory arrays, a holding circuit or dynamic-to-static converter is typically added to the output of the global bit line to ensure that the output holds the evaluated value of the global bit line. This additional circuitry consumes silicon real estate on which the memory array is disposed.

SUMMARY OF THE DISCLOSURE

Among its several aspects, the present invention recognizes the problem of extraneous power consumption caused by the pre-charging and discharging of the global bit line in conventional full-swing arrays during consecutive reads of memory cells which have a 0 value. To this end, an embodiment of the present invention includes statically switching global bit lines. Such a technique reduces power consumption during consecutive reads of 0 values and does so, in a manner, which removes the need for a holding circuit or dynamic-to-static converter circuit at the output.

In one embodiment, a method of driving a global bit line is disclosed. The method includes the step of coupling the plurality of local bit lines to the global bit line through a plurality of tri-state devices. The method further includes the steps of generating a global select signal to enable one of the plurality of tri-state devices, and selecting a corresponding local bit line to drive the output of the enabled tri-state device. In this way, the global bit line is statically driven so that consecutive reads of bits having the same value read over the global bit line do not result in transitioning the state of the global bit line.

A more complete understanding of the present invention, as well as further features and advantages of the invention, will be apparent from the following Detailed Description and the accompanying drawings.

DETAILED DESCRIPTION

The present invention will now be described more fully with reference to the accompanying drawings, in which several embodiments of the invention are shown. This invention may, however, be embodied in various forms and should not be construed as limited to the embodiments set forth herein. Rather, these embodiments are provided so that this disclosure will be thorough and complete, and will fully convey the scope of the invention to those skilled in the art.

Figure 1:
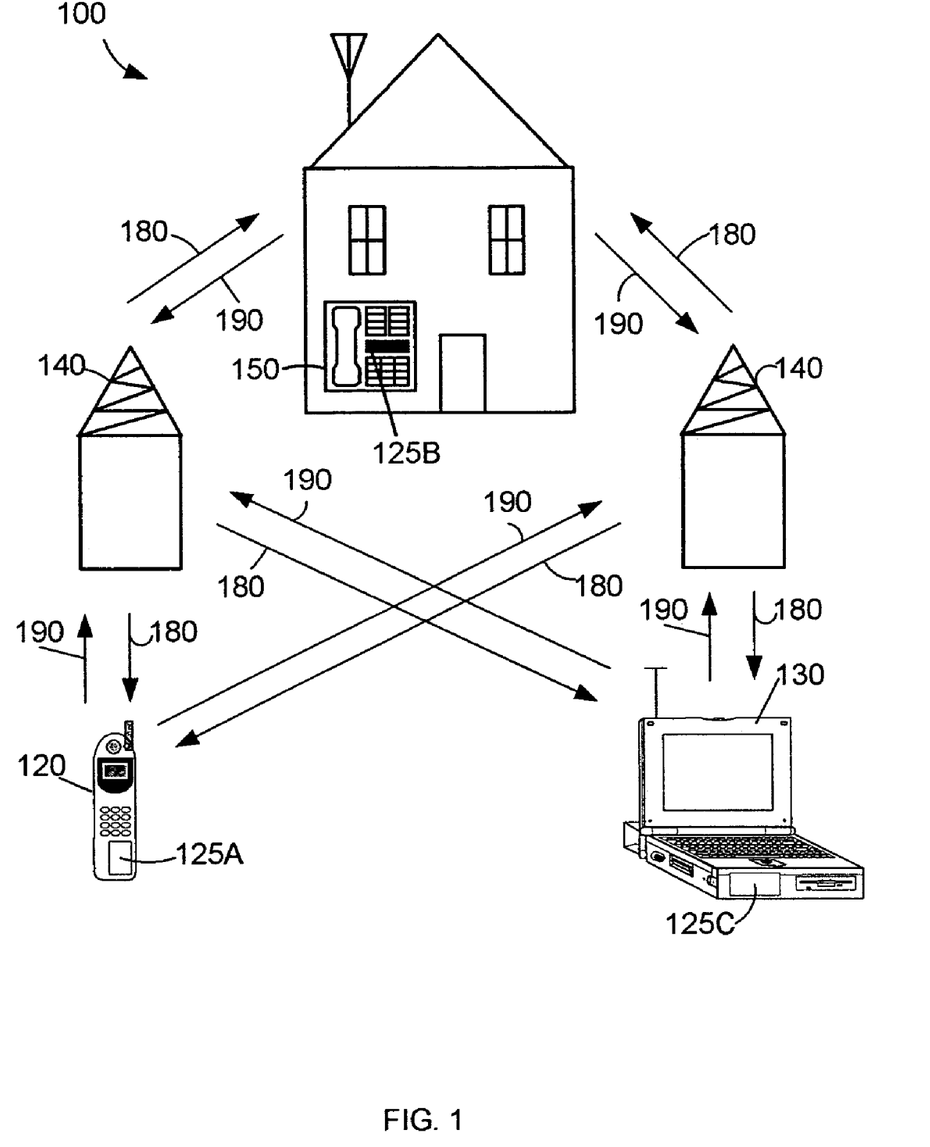
FIG. 1 shows an exemplary wireless communication system in which an embodiment of the invention may be advantageously employed.

FIG. 1 shows an exemplary wireless communication system 100 in which an embodiment of the invention may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include improved full-swing memory arrays 125A, 125B, and 125C, respectively, which are embodiments of the invention as discussed further below. FIG. 1 shows forward link signals 180 from the base stations 140 and the remote units 12, 13, and 15 and reverse link signals 190 from the remote units 12, 13, and 15 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the invention, the invention is not limited to these exemplary illustrated units. The invention may be suitably employed in any device which includes a full-swing memory array.

Figure 2:
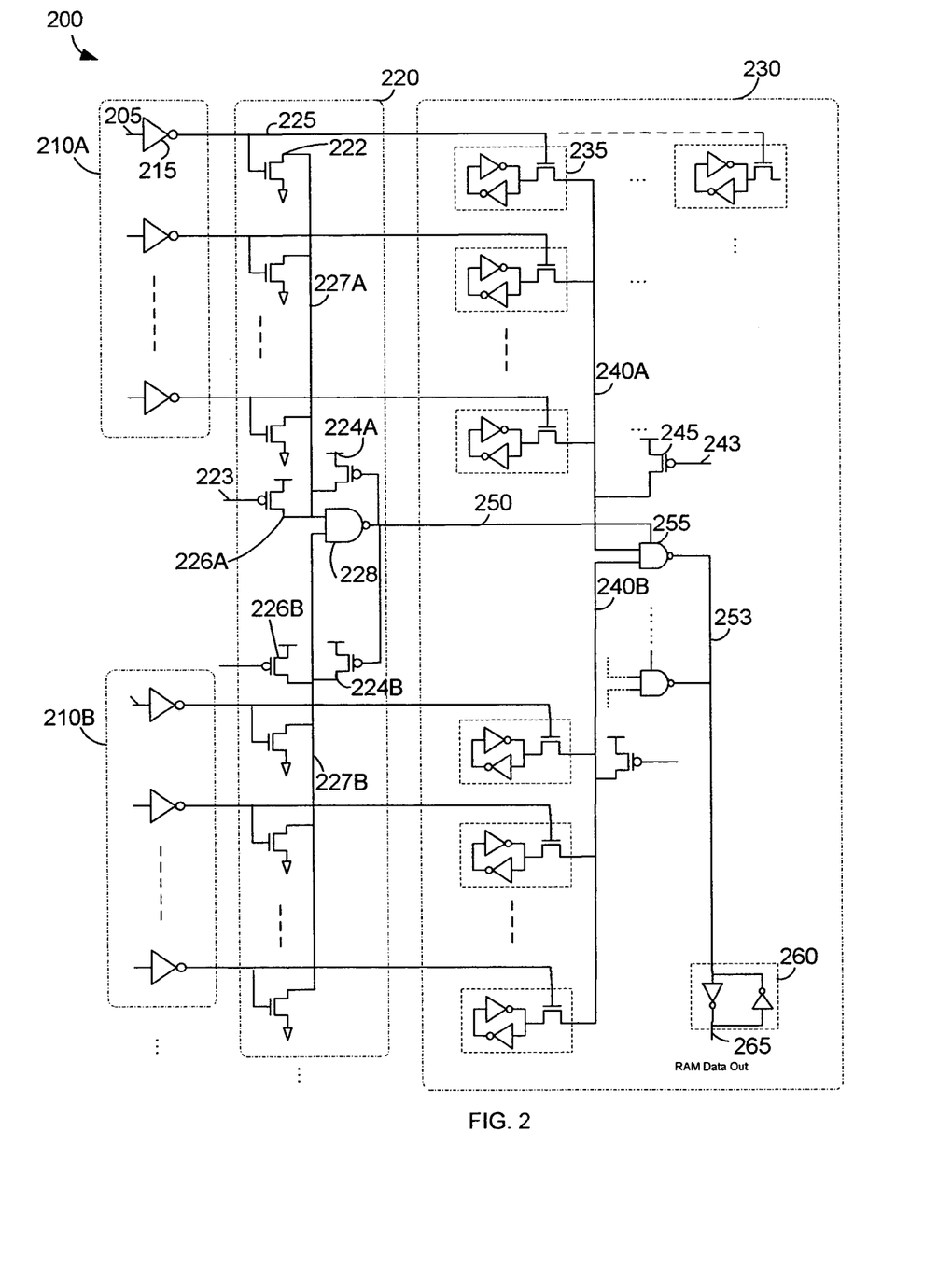
FIG. 2 is a circuit diagram of a read portion of a full-swing memory array system in accordance with one embodiment of the invention.

FIG. 2 is a circuit diagram of a read portion of a full-swing memory array system 200 in accordance with the embodiment of the invention. The read portion of the full-swing memory array system 200 includes optional sets of read word line drivers 210A-210B, distributed dynamic OR component 220, and a full-swing memory array 230 modified according to the teachings of the invention. The sets of read word line drivers 210A and 210B receive an active low, fully decoded, read word line signal and respectively couple to the distributed dynamic OR component 220 and the full-swing memory array 230. The distributed dynamic OR component 220 couples to the full-swing memory array 230. The sets of read word line drivers 210A-210B are optional if the read word line signal is active high.

For the sake of simplicity, only the set of read word line drivers 210A and the distributed dynamic OR component 220 will be described in detail here. The set of read word line drivers 210A includes up to eight inverters such as inverter 215. Inverter 215, for example, receives a read word line signal 205 where the active-low read word line signal 205 is inverted and propagated to the distributed dynamic OR component 220 and the full-swing memory array 230. The distributed dynamic OR component 220 includes sixteen pull-down transistors, such as pull-down transistor 222, where eight of the pull-down transistors 222 terminate their outputs to a common node 227A and eight other of pull-down transistors 222 have their outputs coupled to a common node 227B and to four pull-up transistors 226A, 226B, 224A and 224B. Outputs of pull-up transistors 226A and 224A terminate to the common node 227A. Outputs of pull-up transistors 226B and 224B terminate to the common node 227B. Distributed dynamic OR component 220 also includes a NAND gate 228. NAND gate 228 is coupled in parallel with keeper transistors 224A and 224B. Common nodes 227A and 227B couple to NAND gate 228 which produces as its output a global select signal over global select line 250.

The distributed dynamic OR component 220 receives as input an active-low precharge pulse 223 to precharge common node 227A through pull-up transistor 226A. Once common node 227A is precharged and signal 223 transitions high, the keeper transistor 224A keeps the common node 227A at a logic 1 so that the transition to active logic 0 can be recognized.

Alternatively, common nodes 227A and 227B may be de-coupled by replacing NAND gate 228 with an inverter as shown in an alternative embodiment described in connection with FIG. 5. However, as will be recognized when discussing the embodiment of FIG. 5, by coupling common nodes 227A and 227B through NAND gate 228, the number of global select lines are reduced in half. It is recognized that other couplings between more than two distributed dynamic OR components to reduce the number of global select lines further are contemplated by the teachings of the present invention, and that other logic designs can be implemented to achieve the same results given these teachings.

It should be noted that multiple dynamic OR components such as multiple dynamic OR component 220 may be manufactured in silicon to place common nodes 227A and 227B inline with each other as illustrated in FIG. 2. In so doing, a single routing channel is etched along a coincidental path which advantageously reduces the overall number of routing channels.

The full-swing memory array 230 includes an array of random access memory (RAM) cells such as RAM cell 235. Each row of RAM cells is coupled to the same read word line. The RAM cells in a column of RAM cells are coupled to different read word lines. As illustrated in FIG. 2, a sub-column of eight RAM cells terminate to local bit line 240A. Similarly a second sub-column of eight RAM cells are coupled to a different set of read word lines and terminate to local bit line 240B.

The full-swing memory array 230 also includes a number of pull-up transistors such as pull-up transistor 245, a number of tri-state devices such as tri-state NAND gate 255, and an optional keeper cell 260. The pull-up transistor 245 receives an active-low local bit line precharge pulse 243 to precharge the local bit line 240A. The pull-up transistor 245 keeps local bit line 240A at logic 1, when precharged, until a logic 0 is read from a RAM cell. The tri-state devices propagate output to global bit line 253. The tri-state devices receive input from two local bit lines such as local bit lines 240A and 240B. The local bit lines propagate the contents of a read RAM cell when the appropriate read word line is activated. Tri-state devices are enabled by their respective global select signal. For example, tri-state NAND gate 255 is suitably enabled by global select signal 250.

The number of tri-state devices utilized in a full-swing memory array according to the teachings of the invention varies with the full-swing memory size and the number of RAM cells terminating to a tri-state device. In general, the total number of tri-state devices, $n_t$, may be expressed as follows:

$$n_t = (R*C)/b_r, \qquad (1)$$

where R is the number of rows of the full-swing memory array, C is the number of columns of the full-swing memory array, and $b_r$ is the number of RAM cells terminated to a tri-state device. For example, in a tri-state NAND gate embodiment of a 32×32 full-swing memory array system, $n_t$ would equal 32 rows times 32 columns divided by 16 RAM cells per tri-state NAND gate for a total of 64 tri-state NAND devices. For a 64×32 full-swing memory array configuration, 128 tri-state NAND devices would be utilized. The number of tri-state NAND devices utilized in a particular column, $n_c$, is expressed as follows:

$$n_c = R/b_r \qquad (2)$$

Incidentally, $n_c$ also equals the number of global select lines utilized in the system.

Assuming that FIG. 2 illustrates a 64×32 configuration, the full-swing memory array 230 would contain 64 read lines where each set of read word line drivers has eight inverters to couple to eight read word lines, thus, a total of eight sets of eight word line drivers. Two sets of word line drivers would couple to a corresponding dynamic OR component having a total of sixteen pull down transistors and to sixteen rows of 32 RAM cells. A local bit line would couple eight RAM cells. Each column of the full-swing memory array 230 would contain eight local bit lines, thus, a total of 256 local bit lines. Each column of the full-swing memory array 230 would also contain one global bit line for a total of 32 global bit lines where each global bit line couples to eight local bit lines through four tri-state NAND gates. It should be noted that different size configurations of the full-swing memory system are supported without limiting the embodiments of the invention.

When reading a row of memory, one read word line signal is asserted such as read word line signal 205. By way of example, inverter 215 inverts read word line signal 205 and propagates the inverted signal 225 which is active high to pull-down transistor 222 and to read a corresponding row of RAM cells including RAM cell 235. Assuming common node 227A has been initially precharged through pull-up transistor 226A, pull-down transistor 222 is activated which brings down the common node 227A to ground or logic 0, for example. Assuming only one read word line at most is active at any instant and, thus, common node 227B is held at logic 1, NAND gate 228 propagates logic 0 from common node 227A to logic 1 to enable tri-state NAND gate 255.

Concurrently, the contents of RAM cell 235 are propagated on local bit line 240A. Assuming pull-up transistor 245 has precharged local bit line 240A by precharge signal 243, if the content of RAM cell 235 is logic 0, the local bit line is discharged to logic 0. The enabled tri-state NAND gate 255 then propagates logic 0 from local bit line 240A to logic 1 on global bit line 253. The inverter in the keeper cell 260 inverts the logic 1 to logic 0 and propagates logic 0 to output 265. If the next read signal received which utilizes global bit line 253 results in reading a RAM cell containing a logic 0, the global bit line 253 remains at logic 1 without having to transition, thus, saving power consumption. The operation of the read portion of a full-swing memory array system 200 will be described in further detail in connection with the discussion of FIG. 3.

Figure 3:
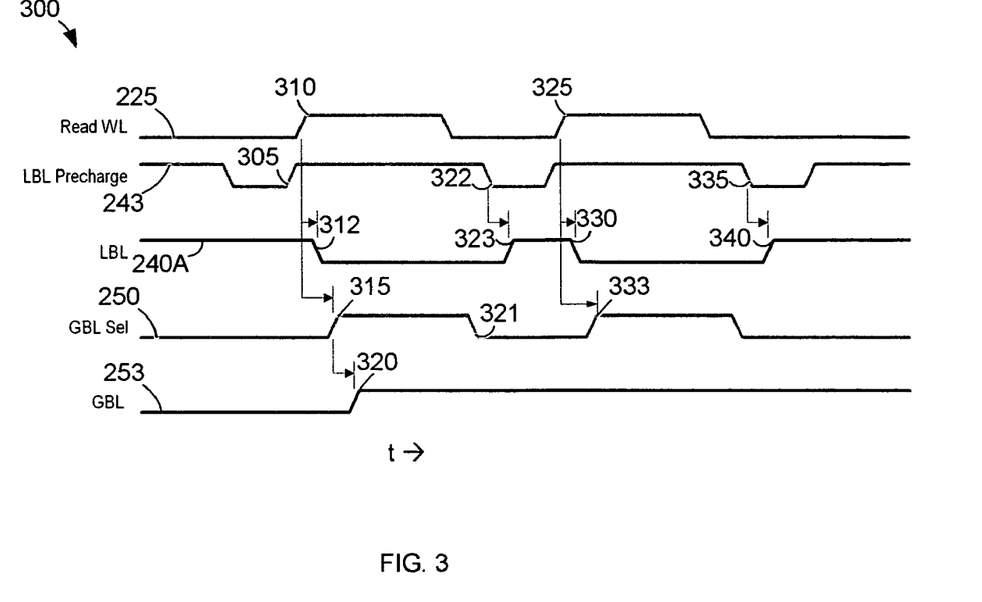
FIG. 3 is a timing diagram illustrating the static nature of the global bit line of FIG. 2 in accordance with the embodiment of the invention.

FIG. 3 is a timing diagram 300 illustrating the static nature of a global bit line such as global bit line 253 of FIG. 2 in accordance with an embodiment of the invention. Timing diagram 300 illustrates five signals including read word line signal 225, local bit line (LBL) precharge signal 243, LBL 240A, global select signal on global select line 250, and the signal on global bit line (GBL) 253.

By way of example, FIG. 3 will be described in combination with FIG. 2 for the situation where two logic 0s are consecutively read from full swing memory 230. To begin, pull-up transistor 245 fully precharges local bit line 240 to logic 1 at time 305. Similarly, pull-up transistors 226A and 226B fully precharge common nodes 227A and 227B to logic 1. Read word line 225 is now asserted at time 310 which results in two concurrent occurrences. First, common node 227A is brought to logic 0 by discharging through pull-down transistor 222. Second, the contents of RAM cell 235, which is assumed to be logic 0, are read, discharging LBL 240A to logic 0.

Returning to the first occurrence, NAND gate 228 receives as an input a logic 0 from common node 227A and, since common node 227B has not been discharged, it stays at a logic 1. Thus, at time 315, global select signal 250 goes active to enable tri-state NAND gate 255, after LBL 240A has been evaluated at time 312.

Now that tri-state NAND gate 255 is enabled and receives as an input a logic 0 over local bit line 240A and, since no read word lines corresponding to word line driver set 210B have been activated, local bit line 240B remains at logic 1. Consequently, at time 320, global bit line 253 transitions to logic 1 and the RAM data output 265 transitions to logic 0 to correspond to the contents of RAM cell 235.

At time 321, the global bit line select signal 250 is disabled before the local bit line precharge signal 243 is enabled at time 322. At time 323, the local bit line 240A has completed precharging through pull-up transistor 245, thus, being preconditioned to logic 1 for the next active read word line signal. At time 325, a subsequent read word line signal is activated which again results in two concurrent occurrences. First, common node 227A is brought to logic 0. Second, the contents of RAM cell 235, which continues to be logic 0, are read, discharging pull-up transistor 245 and transitioning LBL 240A to logic 0 at time 330.

Returning to the first occurrence, NAND gate 228 receives as an input a logic 0 from common node 227A and, since pull-up transistor 226B has not been discharged, a logic 1 from common node 227B. Thus, at time 333, global select signal 250 goes active to enable tri-state NAND gate 255. The output of NAND gate 255 remains at logic 1. Thus, global bit line 253 remains at logic 1 without transitioning as it did at time 320 which results in saving power between consecutive reads over the same global bit line where the value read is 0. This behavior of the global bit line 253 is referred to as static behavior. In contrast, local bit line 240A, like conventional global bit lines, dynamically transitions on each read due to the precharging and discharging of the local bit line capacitance regardless of the previous read data.

It should be noted that although the above example was described in the context of two consecutive reads from the same RAM cell, the global bit line 253 will remain high for consecutive reads of any RAM cell with the same data, which terminates at any tri-state NAND gate coupled to the same global bit line.

Figure 4:
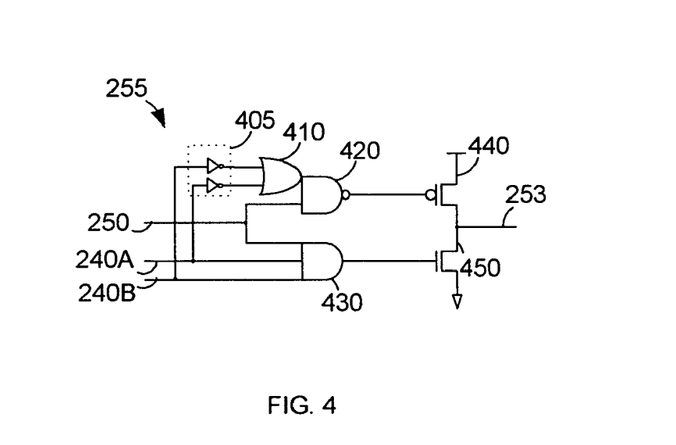
FIG. 4 illustrates details for one suitable tri-state device shown in FIG. 2.

FIG. 4 illustrates details for one suitable embodiment of the tri-state NAND gate 255 shown in FIG. 2. Tri-state NAND gate 255 includes inverters 405, an OR gate 410, a NAND gate 420, an AND gate 430, and an output transistor stack including a pull-up transistor 440, and a pull-down transistor 450. As described above, the NAND gate 255 receives as inputs the global select signal 250 and local bit lines 240A and 240B and produces its output on global bit line 253. Global bit line 253 couples to pull-up transistor 440 and pull-down transistor 450.

Pull-up transistor 440 couples to the output of NAND gate 420. NAND gate 420 couples to the output of OR gate 410 and global select signal 250. OR gate 410 couples to inverters 405. Inverters 405 couple to local bit lines 240A and 240B.

Pull-down transistor 450 couples to the output of AND gate 430. AND gate 430 couples to the global select signal 250 and local bit lines 240A and 240B. Global bit line 253 is logic 1 when either local bit line 240A or 240B are at logic 0 and global select signal 250 is at logic 1. Global bit line 253 is logic 0 when local bit lines 240A and 240B and global select signal 250 are at logic 1. In any other combination of values inputted to NAND gate 255, the value of global bit line 253 will be determined by an enabled NAND gate which is also coupled to it. If none of the NAND gates coupled to the global bit line 253 are enabled, global bit line 253 will maintain the last value read over it due to keeper cell 260.

By utilizing an output stack comprising two transistors, the physical dimensions of the transistors are smaller for a given global bit line load than conventional output stacks having more than two output transistors. Such an advantage reduces the footprint size and the self-capacitance on the global bit line due to the output transistors of the tri-state device.

Figure 5:
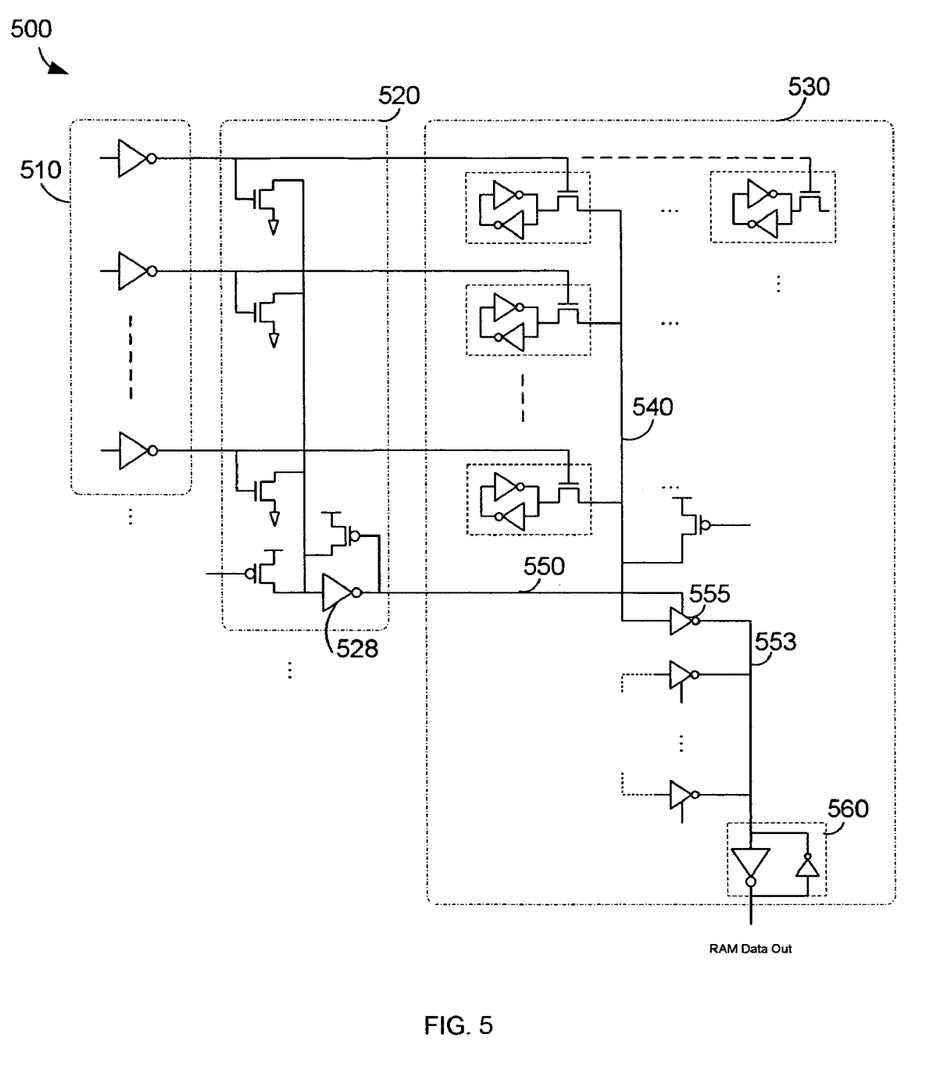
FIG. 5 is an alternative embodiment of the read portion of a full-swing memory array system shown in FIG. 2 in accordance with this embodiment of the invention.

FIG. 5 is an alternative embodiment of a read portion of a full-swing memory array system 200 in accordance with another embodiment of the invention. The read portion of a full-swing memory array system 500 includes read word line drivers 510, a dynamic OR component 520 and a full-swing memory array 530 modified according to the teachings of the invention. The read word line drivers 510 couple to both the dynamic OR component 520 and the full-swing memory array 530. The dynamic OR component 520 couples to the full-swing memory array 530 through global select line 550.

The full-swing memory array system 500 differs from the full-swing memory array system 200 in that one set of word line drivers 510 provides inputs to the dynamic OR component 520. One local bit line 540 couples to global bit line 553 through tri-state inverter 555 and a separate global select line such as global select line 550 is used for each local bit line. The operation of full-swing memory array system 500 is similar to full-swing memory array system 200. If the reference numbers are changed to correspond to elements in FIG. 5, the discussion of the timing diagram of FIG. 3 applies to FIG. 5 as well.

Figure 6:
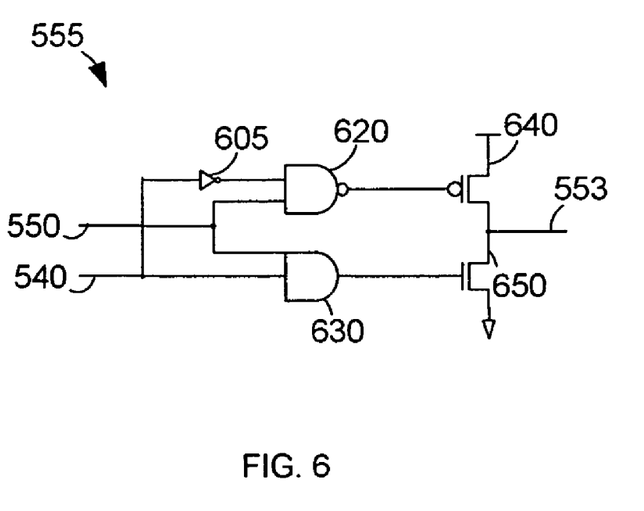
FIG. 6 illustrates details of a tri-state device suitable for use in FIG. 5.

FIG. 6 illustrates details of a tri-state device suitable for use as tri-state inverter 555 shown in FIG. 5. Tri-state inverter 555 includes inverter 605, a NAND gate 620, and an AND gate 630, a pull-up transistor 640, and a pull-down transistor 650. The tri-state inverter gate 555 receives as inputs the global select signal 550 and local bit line 540 and produces its output on global bit line 553. Global bit line 553 couples to pull-up transistor 640 and pull-down transistor 650.

Pull-up transistor 640 couples to the output of NAND gate 620. NAND gate 620 couples to the output of inverter 605 and global select signal 550. Inverter 605 couples to local bit line 540. Pull-down transistor 650 couples to the output of AND gate 630. AND gate 630 couples to the global select signal 550 and local bit line 540.

Global bit line 553 is logic 1 when local bit line 540 is at logic 0 and global select signal 550 is at logic 1. Global bit line 553 is logic 0 when local bit line 540 and global select signal 550 are at logic 1. In any other combination of values inputted to tri-state inverter 555, the value of global bit line 553 will be determined by an enabled tri-state inverter, such as tri-state inverter 555, for example, which is also coupled to the global bit line 553. If none of the tri-state inverters coupled to the global bit line 553 are enabled, global bit line 553 will maintain the last value read over it due to keeper cell 560.

Figure 7:
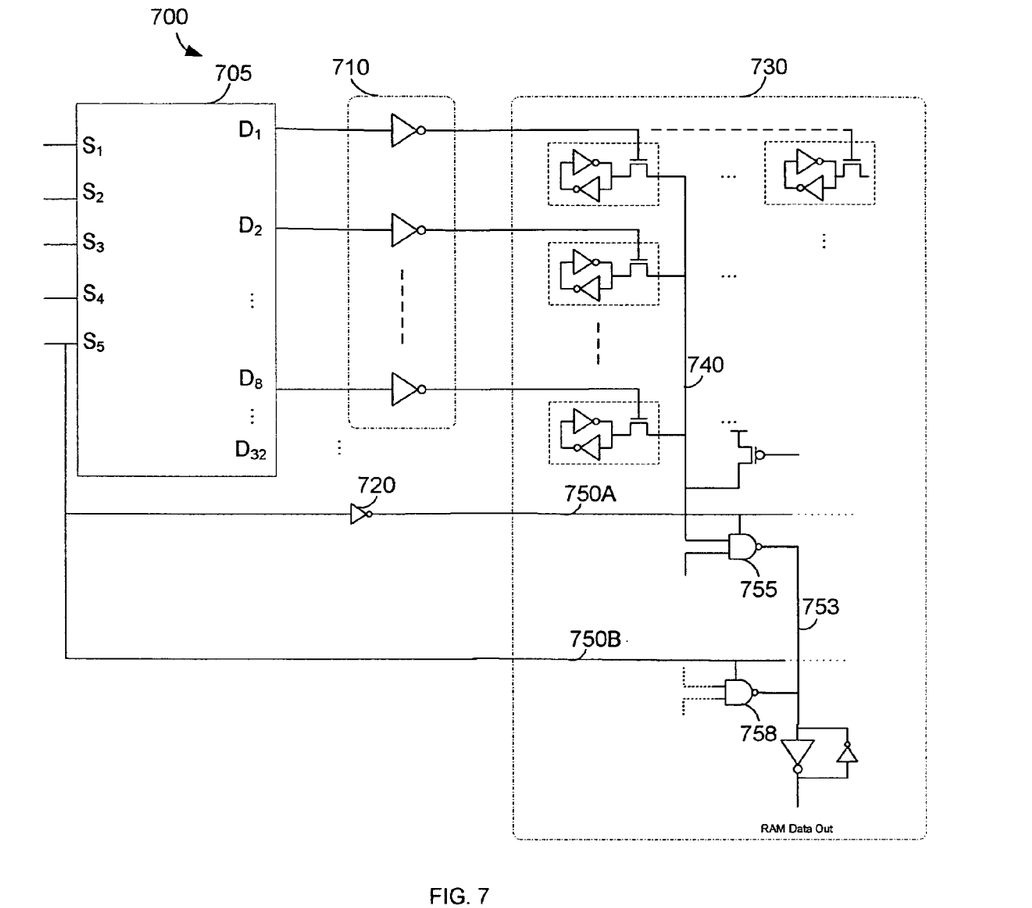
FIG. 7 illustrates an alternative exemplary arrangement for generating a global select signal in accordance with a further embodiment of the invention.

FIG. 7 illustrates an alternative exemplary arrangement for generating a global select signal in accordance with an embodiment of the invention. The alternative embodiment may be used to generate a global select signal by using an encoded memory address rather than a decoded address and the dynamic OR components of FIGS. 2 and 5. The exemplary embodiment shown in FIG. 7 illustrates the read portion of a 32×32 full-swing memory array system 700. The system 700 includes a 5×32 decoder 705, sets of read word line drivers such as word line driver 710, and a 32×32 full-swing memory array 730 modified according to the teachings of the invention.

The 5×32 decoder couples with the sets of read word line drivers. For purposes of simplicity of illustration only one set of word line drivers 710 is shown in FIG. 7. The sets of read word line drivers couple to the full swing memory array 730. The 5×32 decoder receives an encoded memory address, $S_5$-$S_1$ bits. The most significant bit, $S_5$, for example, is coupled to tri-state NAND gate 755 through inverter 720 to generate a global select signal on global select line 750A. Although not shown, global select line 750A is also coupled to tri-state NAND gates corresponding to the other 31 bits in a 32 bit row in order to propagate an entire 32 bit word when a single read word line is activated. Tri-state NAND gate 755 couples to two local bit lines where each local bit line supports eight RAM cells. As such, global select line 750A enables tri-state NAND gates which support the lower order, $S_5$=0, 16 rows of memory.

The most significant bit, $S_5$, is also directly coupled to tri-state NAND gate 758 which is also coupled to global select line 750B. It should be noted that global select line 750B also couples to tri-state NAND gates, not shown, which correspond to the other 31 bits in a 32 bit row. As such, global select line 750B enables tri-state NAND gates which support the higher order, $S_5$=1, 16 rows of memory.

It should be noted that other logical combinations of encoded address bits for generating global select signals are contemplated by the present invention and may differ according to different full swing memory array configurations. For example, a 64×32 full-swing memory array would utilize a 6×64 decoder. When utilizing a tri-state NAND gate embodiment such as FIG. 2, the two most significant bits of the six encoded address bits of the 6×64 decoder would be used to drive all the tri-state NAND gates. In general, the number of most significant address bits needed to control the tri-state NAND gates, n, is determined by the expression:

$$n = \log_2(R/b_r), \quad (3)$$

where R is the number of rows of the full-swing memory array and $b_r$ is the number of RAM cells serviced by a tri-state device. For example, in a tri-state NAND gate embodiment of a 64×32 full-swing memory array system, n would equal $\log_2$(64 rows/16 RAM cells per tri-state NAND gate), which is 2 bits. By way of a tri-state inverter embodiment of a 64×32 full-swing memory array system, n would equal $\log_2$(64 rows/8 RAM cells per tri-state inverter gate), which is 3 bits.

Figure 8:
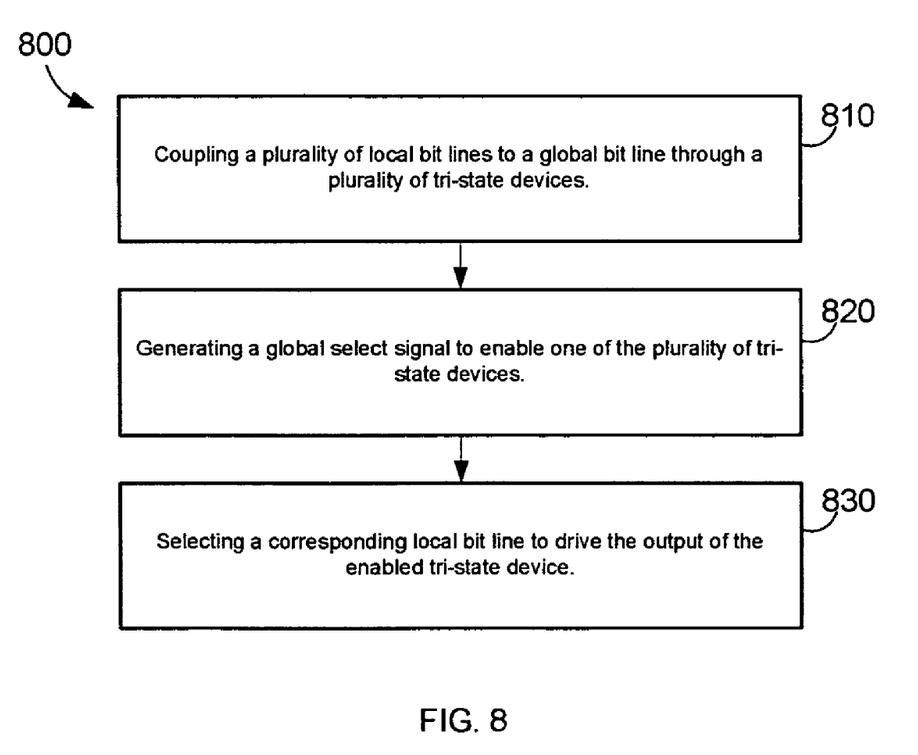
FIG. 8 is a flow chart illustrating a method for statically switching a global bit line in accordance with an embodiment of the invention.

FIG. 8 is a flow chart illustrating a method 800 for statically switching a global bit line in accordance with an embodiment of the invention. At step 810, a plurality of local bit lines is coupled to a global bit line through a plurality of tri-state devices. In FIG. 2, for example, two local bit lines couple through a tri-state NAND gate: to a global bit line. In FIG. 5, for example, one local bit line couples through a tri-state; inverter to a global bit line. At step 820, a global select signal is generated to enable one of the plurality of tri-state devices. In FIG. 2, for example, the global select signal for a tri-state NAND gate is generated when one read word line out of two sets of word line drivers is activated. In FIG. 5, for example, the global select signal for a tri-state inverter is generated when one of the corresponding set of read word lines is activated.

At step 830, a corresponding local bit line is selected to drive the output of the enable tri-state device. In the embodiment of FIG. 2, the tri-state NAND propagates the active local bit line as described. In the embodiment of FIG. 5, the tri-state inverter propagates the corresponding local bit line as described.

Figure 9:
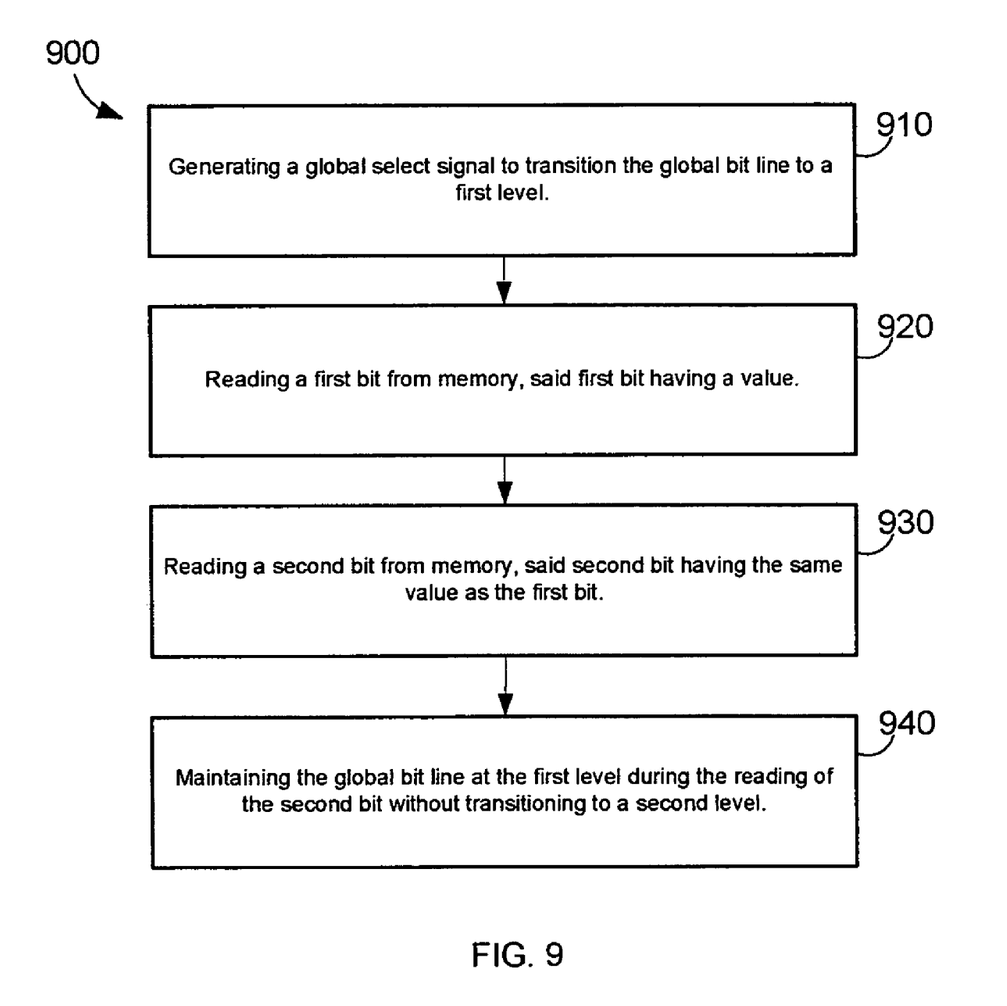
FIG. 9 is a flow chart illustrating a method of reducing power when consecutively reading bits having the same value over a global bit line within memory in accordance with an embodiment of the invention.

FIG. 9 is a flow chart illustrating a method of reducing power when consecutively reading bits having the same value over a global bit line within memory in accordance with an embodiment of the invention. At step 910, a global select signal is generated to transition the global bit line to a first level. Referring to time 315 of FIG. 3, for example, global select signal 250 transitions to an active high level to enable tri-state NAND gate 255, after local bit line 240A has evaluated at time 312. At step 920, a first bit is read from memory. Referring to time 320 of FIG. 3, for example, global bit line 253 transitions to a high value after NAND gate 255 has evaluated. At step 930, a second bit from memory is read. The value of the second bit is the same value as the first bit read. Referring to time 333 of FIG. 3, for example, global select signal 250 transitions to the active high level to again enable tri-state NAND gate 255. At step 940, the global bit line is maintained at the first level during the reading of the second bit without transitioning. Referring to time 333 of FIG. 3, for example, global bit line 253 stays at the same level as it was at time 320.

While the invention is disclosed in the context of a number of embodiments, it will be recognized that a wide variety of implementations may be employed by persons of ordinary skill in the art consistent with the above discussion and the claims which follow below.

We claim:

1. A method of driving a global bit line of a full-swing memory array, the method comprising:
   coupling a plurality of local bit lines to a global bit line through a plurality of tri-state devices;
   generating a global select signal to enable one of the plurality of tri-state devices; and
   selecting a corresponding local bit line to drive the output of the enabled tri-state device whereby consecutive reads of bits having the same value read over the global bit line do not result in transitioning the state of the global bit line.

2. The method of claim 1 wherein the output of the global bit line couples to a keeper cell.

3. The method of claim 1 wherein the generating step further comprises:
   arranging a plurality of transistors to terminate at a common node;
   receiving a read signal at one of the plurality of transistors; and
   transitioning the common node to enable one of the plurality of tri-state devices in response to receiving the read signal.

4. The method of claim 1 wherein the generating step further comprises: utilizing a bit from an encoded memory address to generate the global select signal.

5. The method of claim 1 wherein the selected tri-state device is a a tri-state NAND gate.

6. The method of claim 1 wherein the selected tri-state device is a a tri-state inverter.

7. The method of claim 1 wherein a tri-state device of the plurality of tri-state devices includes an output transistor stack comprising two transistors.

8. A method of reducing read power when reading consecutive bits having the same value over a global bit line within memory, the method comprising:
   generating a global select signal to transition the global bit line to a first level wherein the global select signal enables a tri-state device;
   reading a first bit from memory, said first bit having a value;
   reading a second bit from memory, said second bit having the same value as the first bit; and
   maintaining the global bit line at the first level during the reading of the second bit without transitioning to a second level.

9. The method of claim 8 wherein the generating step further comprises:
   arranging a plurality of transistors to terminate at a common node;
   receiving a read signal at one of the plurality of transistors; and
   transitioning the common node to activate the global select signal.

10. The method of claim 8 wherein the generating step further comprises:
    utilizing a bit from an encoded memory address to generate the global select signal.

11. The method of claim 8 wherein the selected tri-state device is a a tri-state NAND gate.

12. The method of claim 8 wherein the selected tri-state device is a a tri-state inverter.

13. The method of claim 8 wherein the tri-state NAND gate includes an output transistor stack comprising two transistors.

* * * * *